(12) United States Patent
Pelleymounter

(10) Patent No.: US 12,406,838 B2
(45) Date of Patent: *Sep. 2, 2025

(54) RATE ENHANCED PULSED DC SPUTTERING SYSTEM

(71) Applicant: Advanced Energy Industries, Inc., Fort Collins, CO (US)

(72) Inventor: Douglas Pelleymounter, Grand Rapids, MN (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 1029 days.

This patent is subject to a terminal disclaimer.

(21) Appl. No.: 17/122,493

(22) Filed: Dec. 15, 2020

(65) Prior Publication Data

US 2021/0111010 A1 Apr. 15, 2021

Related U.S. Application Data

(63) Continuation of application No. 15/802,791, filed on Nov. 3, 2017, now Pat. No. 10,910,203, which is a
(Continued)

(51) Int. Cl.
*H01J 37/34* (2006.01)
*C23C 14/34* (2006.01)
*C23C 14/35* (2006.01)

(52) U.S. Cl.
CPC ...... *H01J 37/3476* (2013.01); *C23C 14/3485* (2013.01); *C23C 14/35* (2013.01);
(Continued)

(58) Field of Classification Search
CPC .............. C23C 14/3485; H01J 37/3476; H01J 37/3467
See application file for complete search history.

(56) References Cited

U.S. PATENT DOCUMENTS

| 4,478,700 A | 10/1984 | Criss |
| 4,693,805 A | 9/1987 | Quazi |

(Continued)

FOREIGN PATENT DOCUMENTS

| CN | 102985996 A | 3/2013 |
| CN | 103668095 A | 3/2014 |

(Continued)

OTHER PUBLICATIONS

Hochstrasser, M, "Extended European Search Report Regarding Application No. 18889771.4", Sep. 7, 2021, pp. 9, Published in: EP.
(Continued)

*Primary Examiner* — John J Brayton
(74) *Attorney, Agent, or Firm* — NOD Law PC

(57) ABSTRACT

A sputtering system and method are disclosed. The system includes first power source coupled between a first and second power leads, and the first power source provides a first voltage that alternates between positive and negative during each of multiple cycles. The system also includes a second power source coupled between the second power lead and a third power lead, and the second power source provides a second voltage that alternates between positive and negative during each of the multiple cycles. A controller of the system controls the first power source and the second power source to phase-synchronize the first voltage with the second voltage, so both, the first voltage and the second
(Continued)

voltage, are simultaneously negative during a portion of each cycle and simultaneously positive during another portion of each cycle.

17 Claims, 9 Drawing Sheets

Related U.S. Application Data continuation of application No. 14/697,267, filed on Apr. 27, 2015, now Pat. No. 9,812,305.

(52) U.S. Cl.
CPC ...... *H01J 37/3405* (2013.01); *H01J 37/3438* (2013.01); *H01J 37/3444* (2013.01); *H01J 37/3467* (2013.01); *H01J 2237/2485* (2013.01); *H01J 2237/327* (2013.01); *H01J 2237/332* (2013.01)

(56) References Cited

U.S. PATENT DOCUMENTS

| | | | |
|---|---|---|---|
| 5,427,669 | A | 6/1995 | Drummond |
| 5,777,863 | A * | 7/1998 | Kowalevskii ....... H01J 37/3444 363/63 |
| 5,897,753 | A | 4/1999 | Schatz et al. |
| 6,005,218 | A | 12/1999 | Walde et al. |
| 6,063,245 | A | 5/2000 | Frach et al. |
| 6,183,605 | B1 | 2/2001 | Schatz et al. |
| 6,222,321 | B1 | 4/2001 | Scholl et al. |
| 6,338,777 | B1 | 1/2002 | Longstreth White |
| 6,340,416 | B1 | 1/2002 | Goedicke et al. |
| 9,812,305 | B2 | 11/2017 | Pelleymounter |
| 10,373,811 | B2 * | 8/2019 | Christie ............. H01J 37/3438 |
| 10,910,203 | B2 * | 2/2021 | Pelleymounter .... H01J 37/3438 |
| 11,049,702 | B2 * | 6/2021 | Pelleymounter .... H01J 37/3405 |
| 2003/0209423 | A1 * | 11/2003 | Christie ............. H01J 37/3405 204/192.12 |
| 2004/0075060 | A1 | 4/2004 | Luten et al. |
| 2006/0278518 | A1 | 12/2006 | Kouznetsov |
| 2009/0205954 | A1 | 8/2009 | Hanika et al. |
| 2010/0196624 | A1 | 8/2010 | Ruuttu et al. |
| 2010/0236919 | A1 | 9/2010 | Alami et al. |
| 2010/0276283 | A1 | 11/2010 | Muenz et al. |
| 2011/0120860 | A1 | 5/2011 | Horishita et al. |
| 2011/0180389 | A1 | 7/2011 | Cremer et al. |
| 2011/0248633 | A1 | 10/2011 | Nauman et al. |
| 2014/0234616 | A1 | 8/2014 | Hultman et al. |
| 2016/0314946 | A1 | 10/2016 | Pelleymounter |
| 2017/0022604 | A1 | 1/2017 | Christie et al. |
| 2018/0108520 | A1 | 4/2018 | Pelleymounter |
| 2021/0287888 | A1 | 9/2021 | Pelleymounter |

FOREIGN PATENT DOCUMENTS

| | | |
|---|---|---|
| DE | 102009051056 A1 | 5/2011 |
| EP | 0692138 B1 | 1/2004 |
| EP | 1458006 A1 | 9/2004 |
| EP | 2439763 A2 | 4/2012 |
| EP | 2784799 A1 | 10/2014 |
| EP | 3089196 A1 | 11/2016 |
| JP | H0397846 A | 4/1991 |
| JP | 2009-284733 A | 12/2009 |
| WO | 02103078 A1 | 12/2002 |
| WO | 2007051461 A1 | 5/2007 |
| WO | 2009040406 A2 | 4/2009 |
| WO | 2009131737 A1 | 10/2009 |

OTHER PUBLICATIONS

Advanced Energy Industries, Inc., "Enhanced Plasma Containment for Inline Sputtering Systems", Jun. 18, 2008, pp. 4, Published in: US.
SIPO, "Office Action Regarding Chinese Patent Application No. 201680003857.6", Dec. 26, 2018, pp. 15, Published in: CN.
SIPO, "Office Action Regarding Application No. 201610490917.3", May 7, 2019, pp. 14, Published in: CN.
SIPO, "Office Action Regarding Chinese Application No. 201610490917.3", Mar. 9, 2020, pp. 11, Published in: CN.
Brayton, John Joseph, "Office Action Regarding U.S. Appl. No. 15/844,438", Jan. 7, 2021, pp. 48, Published in: US.
Anonymous, "PCT Third Party Observation Regarding International Application No. PCT US2018/016223", Mar. 24, 2020, pp. 7, Published in: PCT.
European Patent Office, "Office Action Regarding European Patent Application No. 18889771.4", Jul. 22, 2020, pp. 3, Published in: EP.
Wittman-Regis, Agnes, "International Preliminary Report on Patentability Regarding International Application No. PCT/US2018/016223", Jun. 25, 2020, pp. 10, Published in: CH.
Brayton, John Joseph, "Office Action Regarding U.S. Appl. No. 15/802,791", Mar. 30, 2020, pp. 36, Published in: US.
Hochstrasser, M, "Office Action Regarding European Patent Application No. 18 158 711.4", Jul. 3, 2020, pp. 5, Published in: EP.
Hochstrasser, M, "European Search Report Re Application No. EP18158711", May 17, 2018, Published in: EP.
M. Hochstrasser, "Extended European Search Report Re Application No. 16831032.4", Feb. 20, 2018, pp. 6, Published in: EPO.
Weekes, Chris, "International Search Report and Written Opinion re Application No. PCT/US2016/042389", Oct. 20, 2016, pp. 11, Published in: AU.
Timon Wanga, "United State Final Office Action Re U.S. Appl. No. 14/809,084", Mar. 27, 2018, pp. 11, Published in: US.
Berman, Jason, "Office Action Regarding U.S. Appl. No. 14/809,084", Aug. 10, 2018, pp. 14, Published in: US.
Wanga, Timon, "United States Office Action Re U.S. Appl. No. 14/809,084", Sep. 22, 2017, pp. 20, Published in: US.
Timon Wanga, "United State Office Action Re U.S. Appl. No. 14/809,084", Jun. 9, 2017, pp. 7, Published in: US.
Andrew Rapson, "International Search Report Re Application No. PCT/US2018/016223", May 7, 2018, pp. 15, Published in: AU.
Aguilar, Maria, "European Search Report Re Application No. EP16165652", Aug. 18, 2016, pp. 2, Published in: EP.
Wanga, Timon, "United States Office Action Re U.S. Appl. No. 14/697,267", Jan. 25, 2017, pp. 18, Published in: US.
Advanced Energy, "Ascent DMS Advanced Dual-Magnetron Sputtering Accessories", 2018, pp. 8, Published in: US.
Pelleymounter, D.R., "Raising The Bar on Reactive Deposition Sputter Rates", "58th Annual Technical Conf Proceedings", Apr. 28, 2015, pp. 218-222, Publisher: Society of Vacuum Coaters, Published in: US.
Scholl, R., "Redundant Anode Sputtering: A Novel Approach to The Disapperaing Anode Problem", "Retrieved from http://www.advanced-energy.com/upload/File/White_Papers/SL-WHITE2-270-01.pdf", Jan. 1, 2000, pp. 8.
Society of Vacuum Coaters, "List of Abstracts for SVC Technical Program: Apr. 27-30, SVC 58th Annual Technical Conference Proceedings", Apr. 27, 2015, pp. 58, Published in: US.
Notice of Reasons for Rejection received for Japanese Patent Application Serial No. 2020552669 dated Dec. 13, 2021, 6 pages (Including English Translation).
Notice of Grounds for Rejection received for Korean Patent Application No. 10-2020-7020262 dated Oct. 4, 2022, Korean Intellectual Property Office, Korea, 8 pages (English Translation).

\* cited by examiner

RATE ENHANCED PULSED DC SPUTTERING SYSTEM

CLAIM OF PRIORITY UNDER 35 U.S.C. § 120

The present application for patent is a continuation of U.S. patent application Ser. No. 15/802,791, entitled "Rate Enhanced Pulsed DC Sputtering System," filed Nov. 3, 2017, which is a continuation of U.S. patent application Ser. No. 14/697,267, entitled "Rate Enhanced Pulsed DC Sputtering System," filed Apr. 27, 2015, both of which are assigned to the assignee hereof and expressly incorporated by reference herein.

FIELD

The present invention relates generally to sputtering systems, and more specifically to pulsed DC sputtering.

BACKGROUND

Sputtering historically includes generating a magnetic field in a vacuum chamber and causing a plasma beam in the chamber to strike a sacrificial target, thereby causing the target to sputter (eject) material, which is then deposited as a thin film layer on a substrate, sometimes after reacting with a process gas. Sputtering sources may employ magnetrons that utilize strong electric and magnetic fields to confine charged plasma particles close to the surface of the target. An anode is generally provided to collect electrons from the plasma to maintain plasma neutrality as ions leave to bombard the target.

The industry has evolved over the years in various attempts to maximize sputtering efficiency, decrease power consumption requirements, minimize the heat load of the system, minimize arcing and/or increase the types of substrates that may be used in the system.

Moreover, sputtering a thin film of, for example, titanium dioxide ($TiO_2$) or silicon dioxide ($SiO_2$) onto a polyethylene substrate presents unique challenges in the industry because polyethylene is a plastic with a low melting point or low heat tolerance. Currently-available sputtering systems, whether DC or AC type systems, require a high heat load to effectuate sputtering and/or the deposition of $TiO_2$ or $SiO_2$, yet this high heat load, caused by a high current density, effectively eliminates polyethylene as a suitable substrate for many intended high power applications. Compounding the problem, if the heat load in the currently-available sputtering systems is lowered to a level that does not melt or otherwise render the polyethylene unsuitable, e.g., by reducing the power applied, the deposition rate is lowered to a point that results in a low-quality deposited layer and/or increases the required time for sputtering to a point that renders the use of polyethylene as a substrate infeasible from a commercial perspective.

There therefore remains a need for a device that provides improved sputtering deposition rates at a lower heat load.

SUMMARY

Embodiments disclosed herein address the above stated needs by providing a system, method, or non-transitory memory having instructions for pulsed direct current sputtering.

In some aspects, a pulsed direct current system is provided. A first power source is coupled to a first and second power leads, and the first power source is configured to provide a first voltage that alternates between positive and negative relative to the first power lead during each of multiple cycles. A second power source is coupled to the second power lead and a third power lead, and the second power source is configured to provide a second voltage that alternates between positive and negative relative to the third power lead during each of the multiple cycles. A controller is configured to control the first power source and the second power source to phase-synchronize the first voltage with the second voltage, so both, the first voltage and the second voltage, are simultaneously negative during a portion of each cycle and simultaneously positive relative to the first and third power leads during another portion of each cycle.

Oher aspects include a non-transitory memory including non-transitory instructions. The non-transitory instructions are at least one of executable by a processor to execute a method and accessible by a field programmable gate array to configure the field programmable gate array to execute the method. The method may cause a first power source to apply a first voltage to a second power lead that alternates between positive and negative relative to a first power lead, and cause a second power source to apply a second voltage to the second power lead that alternates between positive and negative relative to a third power lead. In addition, the method includes causing the first power source and the second power source to phase-synchronize the first voltage with the second voltage, so both, the first voltage and the second voltage, are simultaneously negative and simultaneously positive at the second power lead relative to the first and third power leads over multiple cycles.

DETAILED DESCRIPTION

The word "exemplary" is used herein to mean "serving as an example, instance, or illustration." Any embodiment described herein as "exemplary" is not necessarily to be construed as preferred or advantageous over other embodiments. For example, when power is applied to the first and second magnetrons 104, 106, the power sources 140, 142 will generate a current and a voltage with a first polarity, and when power is applied to the anode 108, the power sources 140, 142 will generate a current and a voltage with a second polarity that is reversed to the first polarity. A "power cycle" is intended to reference a time period including a time of power having a voltage with the first polarity followed by a time of power having a voltage with the second polarity. Further, for the purpose of this disclosure, all terms, and particularly terms such as "simultaneously" and "equal to" are intended to mean "within the tolerances of process or manufacturing controls". For example, it will be understood that a synchronizing unit, such as unit 120, may not achieve perfect synchronization between the power sources 140, 142, and therefore the term "simultaneous(ly)" is to be understood as meaning "substantially simultaneous(ly)".

Figure 1:
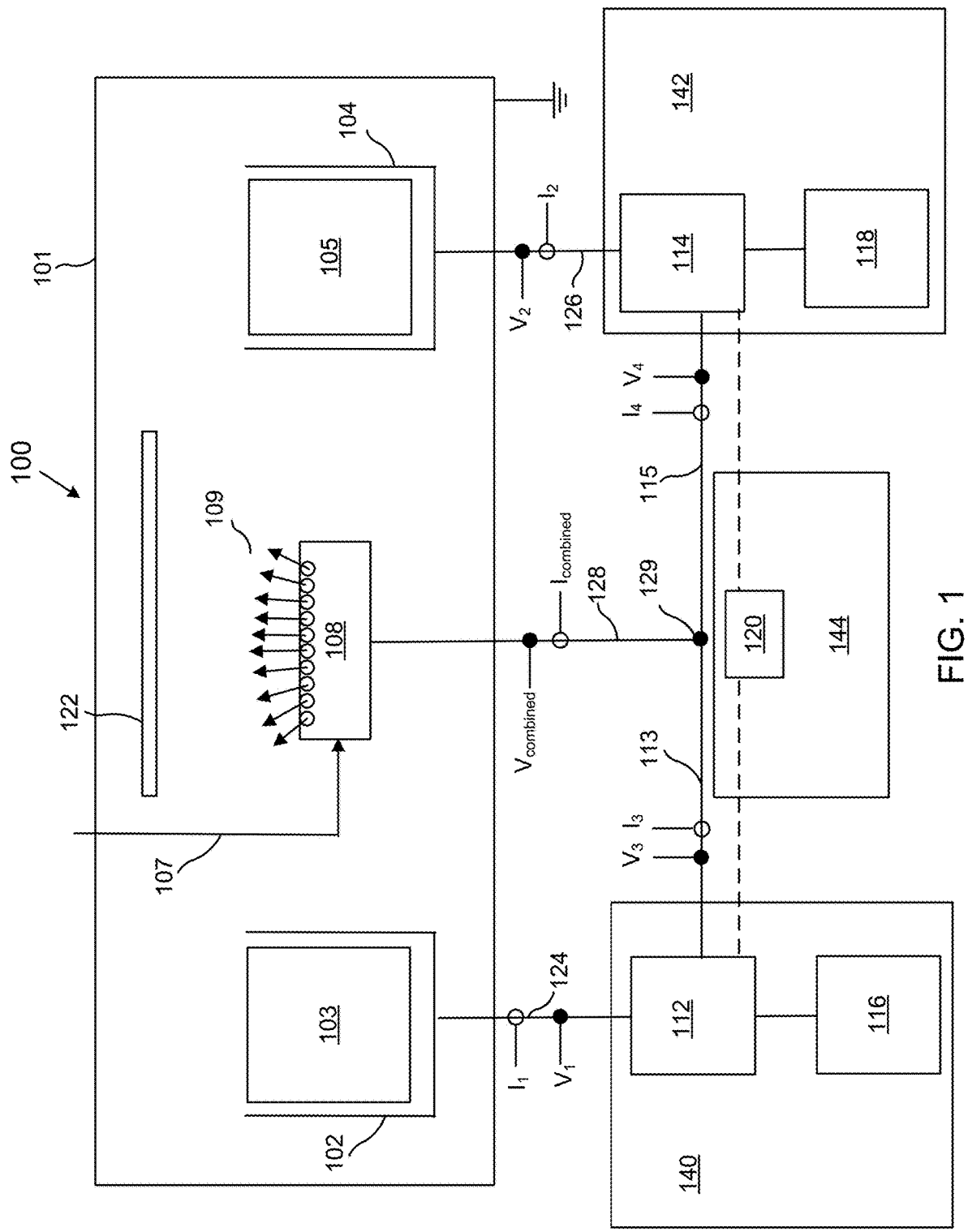
FIG. 1 is a block diagram illustrating some aspects of a sputtering system.

Turning now to FIG. 1, an exemplary pulsed direct current sputtering system 100 is now described in detail. Generally stated, the system 100 provides a user with the ability to achieve higher deposition rates, as compared to prior AC dual magnetron and pulsed DC single magnetron sputtering approaches, by delivering higher power at a particular current. More specifically, at a particular power level, some embodiments of the system 100 disclosed herein may cut the RMS current in the endblocks or magnetrons by about half, as compared to prior AC sputtering systems. As a consequence, in cases in which the endblock current rating is limited, the system 100 as disclosed may enable delivery of nearly twice the power while staying within the endblock current rating limit.

In a more specific example, the system 100 may be used by web coaters, who have in the past struggled with maintaining the sputtering process at manageable temperatures throughout production runs of over 7 days, to improve deposition rates and quality. In currently-available systems, web coaters apply ventilation to the plasma chamber 101 to reduce the heat, which increases the production rate by 35% as compared to systems without ventilation. The system 100 presently disclosed provides, in contrast, a doubling of the production rate before cooling is even applied. That is, the system 100 and/or method 400 disclosed herein may lower the heat load or heating experienced by a substrate, even under application of the same power, and may be practiced to apply a high-quality layer of material, such as silicon dioxide ($SiO_2$) or titanium dioxide ($TiO_2$), onto a polyethylene substrate, without destroying the polyethylene substrate, and in a shortened period of time as compared to those realized in currently-available systems. The $SiO_2$ or $TiO_2$ layer may be thicker than what may be realized in currently-available designs.

The system 100 may provide about 1.5 times the deposition rate of DC single magnetron or pulsed DC single magnetron sputtering, and about 2 times the deposition rate of AC dual magnetron or bi-polar pulsed DC sputtering, with half the heat load experienced in the currently-available sputtering systems. The system 100 may include a plasma chamber 101 enclosing a first magnetron 102 engaged with a first target 103, a second magnetron 104 engaged with a second target 105, and an anode 108. The system 100 may include a substrate 122 upon which the system 100 is to deposit a thin film material in a sputtering process.

A first bi-polar controllable pulsed DC power supply 112 (or first bi-polar DC supply 112) and a second bi-polar controllable pulsed DC power supply 114 (or second bi-polar DC supply 114) may be provided. The first and second bipolar DC supplies 112, 114 may receive direct power from a first direct current (DC) supply 116 and a second DC supply 118 respectively. The first bi-polar DC supply 112 may be coupled to the first magnetron 102 by way of power lead(s) 124, and configured to apply a sputtering power to the first target 103. Similarly, the second bi-polar DC supply 114 may be coupled to the second magnetron 104, and configured to apply a sputtering power to the second target 105. The first and second bi-polar DC supplies 112, 114 may be coupled to the anode 108 by way of lead(s) 128, and, more specifically, an electrical joint 129 may couple a first anode lead 113 from the first bi-polar DC supply 112 to a second anode lead 115 from the second bi-polar DC supply 114. That is, the first power source 140 may be operatively coupled to the anode 108 and the first target 103 by way of the first magnetron 102 through leads 124, 113, and 128, while the second power source 142 may be operatively coupled to the anode 108 and the second target 105 by way of the second magnetron 104 through leads 126, 115, and 128.

In some embodiments, the anode may be the wall of the plasma chamber 101; however, in others and as illustrated, the anode 108 may be a floating anode 108, and may further have a gas inlet 107 and a plurality of gas outlets 109 enabling the hollow cathode effect to aid in keeping the outlets clean for a more stable operation. Those of skill in the art will understand that, because the anode 108 is a part of the power supply delivery circuit, gas entering at the inlet 107 has an increase chance of breaking its bonds. For example, oxygen gas $O_2$ is more likely to break into two oxygen atoms as the gas exits the plurality of outlets 109, while nitrogen gas $N_2$ is more likely to break into two nitrogen atoms as it exits the plurality of outlets 109, resulting in films on the substrate 122 that are of higher quality than would be expected without the use of an anode 108 that provides a hollow cathode effect.

Some embodiments provide a system 100 that maintains an anode that does not "disappear" as is known in the industry, and in the system disclosed herein, the anode 108 may be kept clean or cleansed through operation at higher temperatures, by hollow cathode discharge in the plurality of outlets 109, and/or by sputtering directly during an application of anode power.

In some embodiments, the system 100 maintains the anode 108, which may be a floating gas anode, at a relatively high temperature suitable for maintaining a clean anode, while not causing the heat load within the chamber 101 and/or experienced by the substrate 122 to become so high as to damage the substrate 122, such as a polyethylene substrate, therein. In some embodiments, the system 100 may maintain the anode 108 at 100° Celsius, or more. In some embodiments, the system 100 may maintain the anode 108 at a temperature of about 150° Celsius. In some embodiments, the system 100 may maintain the anode 108 at 150° Celsius or less, such as when in use by web coaters depositing titanium dioxide ($TiO_2$) or silicon dioxide ($SiO_2$) onto a polyethylene substrate. In some embodiments, the system 100 may maintain the anode 108 at 200° Celsius or more, such as when in use by glass coaters.

Continuing with FIG. 1, a controller 144 comprising a synchronizing unit 120 may synchronize power signals from the first and second bi-polar DC supplies 112, 114 in a manner that will be described in later portions of this document. In some embodiments, a first power source 140 may comprise the first bi-polar controllable pulsed DC power supply 112 and the first DC supply 116. Similarly, a second power source may comprise the second bi-polar controllable pulsed DC power supply 114 and the second DC supply 118.

Of note, each of the first and second power supplies 140, 142 may be arranged and configured to be aware of the other one of the first and second power supplies 140, 142, without attempting to control the operation of the other one of the first and second power supplies 140, 142. Applicant has achieved this "awareness without control" by first configuring a duty cycle (e.g. 40 kHz) of each of the first and second bi-polar DC supplies 112, 114, and subsequently coupling the synchronizing unit 120 and configuring one of the first and second bi-polar DC supplies 112, 114 to be perceived as a transmitter for the purpose of frequency synchronization, and the other one of the first and second bi-polar DC supplies 112, 114 to be perceived as a receiver, for the purpose of frequency synchronization. In contrast, each one of the first and second DC supplies 116, 118 are independent, and do not rely on awareness of the other one of the first and second DC supplies 116, 118 to properly function.

Although not required, in one implementation, the first and second DC supplies 116, 118 may each be realized by one or more ASCENT direct current power supplies sold by Advanced Energy Industries, Inc. of Fort Collins, Colorado, U.S.A. And the first and second bi-polar DC supplies 112, 114 may each be realized by an ASCENT DMS Dual-magnetron sputtering accessory, which is also sold by Advanced Energy Industries, Inc. of Fort Collins, Colorado, U.S.A. In this implementation, the first and second power sources 140, 142 are each realized as an AMS/DMS stack wherein the ASCENT direct current power supply may provide straight DC power and perform arc management functions, and the DMS dual-magnetron sputtering accessory generates a pulsed DC waveform from the straight DC power. Beneficially, the DMS dual-magnetron sputtering accessories may be located in close proximity to the chamber 101, and the ASCENT direct current power supplies may be located remotely (e.g., in a remote rack) from the chamber 101. The 120 synchronizing unit in this implementation may be realized by a common exciter (CEX) function of the DMS accessories.

In another embodiment, each of the first and second power sources 140, 142 may be realized by an integrated pulsed DC power supply.

Figure 2:
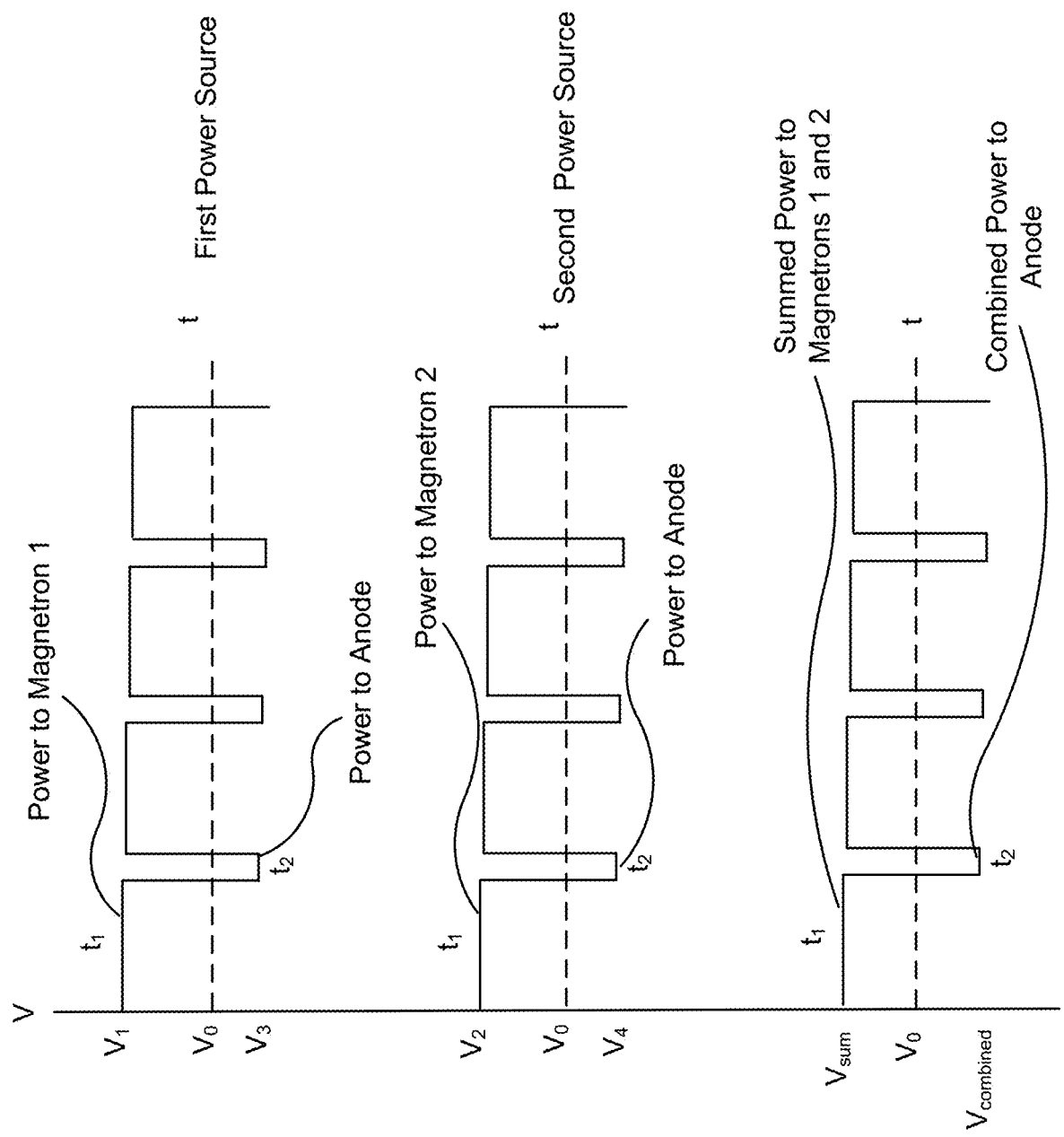
FIG. 2 is a graph of some aspects of power applications in a sputtering system.

Turning now to FIG. 2, in some embodiments, the controller 144 and/or synchronizing unit 120 may be configured to cause the first and second bi-polar DC supplies 112, 114 or first and second power sources 140, 142 to simultaneously apply sputtering power to the first and second magnetrons 104, 106, respectively, followed by a simultaneous anode power to the anode 108.

In some embodiments, a cycle of power may be applied to the magnetrons 102, 104 and the anode 108. As illustrated in FIG. 2 the synchronizing unit 120 may be configured to cause the first and second bi-polar DC supplies 112, 114 to apply power to the magnetrons 104, 106 for a first period of time $t_1$, followed by an application of power to the anode 108 for a second period of time $t_2$, wherein the first period of time $t_1$ is 80% of a sputtering cycle comprising the first and second periods of time $t_1$, $t_2$. The second period of time $t_2$ may be about 20% of the cycle. In some embodiments, the first period of time $t_1$ may be at least 70% of the cycle, or, in some embodiments, between 70% and 90% of the cycle. The second period of time $t_2$ may be less than 30% of the cycle, or between 30% and 10% of the cycle. In some embodiments, the first period of time $t_1$ may be between 80% and 90% of the cycle, and the second period of time $t_2$ may be between 20% and 10% of the cycle. In some embodiments, the first period of time $t_1$ may be between 85% and 90% of the cycle, and the second period of time $t_2$ may be between 15% and 10% of the cycle.

As discussed further herein, the controller 144 may be configured to control the first power source 140 and the second power source 142, and may have a non-transitory memory including non-transitory instructions to effectuate the methodologies described herein. For example, the non-transitory instructions may be accessible by a field programmable gate array to configure the field programmable gate array to execute one or more methods. In some embodiments, the non-transitory instructions are executable by a processor and/or accessible by the field programmable gate array to configure the field programmable gate array to execute one or more methods. In other embodiments, one or more aspects of the controller 144 may be realized by hardware (e.g., application specific integrated circuits) that is persistently configured to control the first and second power sources 140, 142 to effectuate one or more of the methods described herein.

Turning now to FIG. 2, certain novel and innovative aspects of a sputtering process that may be executed by the system 100 are described in detail. As illustrated in FIG. 2, the system 100 may be configured to apply a first power having a first voltage $V_1$ to the first magnetron 102 for a first period of time $t_1$. Simultaneously, or for the first period of time $t_1$, the system 100 may apply a second power having a second voltage $V_2$ to the second magnetron 104. In some embodiments, a magnitude of the first voltage $V_1$ may be substantially the same as a magnitude of the second voltage $V_2$, although it will be understood that the values are highly idealized, and may not be perfectly matched in practice. The simultaneous application of the first power and the second power may result in an arbitrary summed voltage $V_{sum}$ in a sputtering power applied for the first period of time $t_1$. That is, the term "summed voltage $V_{sum}$" is not intended to mean that the system as a whole experiences a summed voltage, but rather that the first magnetron 102 may experience a voltage and the second magnetron 104 may experience a voltage, with the voltage being summed for the purpose of analysis.

Continuing with FIG. 2, the first period of time $t_1$ may be followed by a second period of time $t_2$. During the second period of time $t_2$, the system 100 may be configured to cause the first power source 140 to apply an anode power having a third voltage $V_3$ to the anode 108 and to substantially simultaneously cause the second power source 142 to apply an anode power having a fourth voltage $V_4$ to the anode 108. That is, the third voltage $V_3$ and the fourth voltage $V_4$ may be combined to apply a combined power having a combined voltage $V_{combined}$ to the anode 108 for the second period of time $t_2$, because the third anode voltage $V_3$ and the fourth anode voltage $V_4$ are applied together at the anode 108. Of note, when the two power sources 140, 142 apply power to the anode 108 simultaneously, the anode current is additive; however, the resulting combined voltage $V_{combined}$ may not necessarily be, and generally is not, the sum of the third voltage $V_3$ and the fourth voltage $V_4$. Those of skill in the art will understand that $V_1$, $V_2$, and $V_{combined}$ are all affected by the impedance within the chamber.

While the graphical depictions in FIG. 2 are highly idealized, an approximation of the powers and voltages may be provided. In some embodiments, the first voltage $V_1$ may be between about 300 Volts and about 800 Volts. In some embodiments, the first voltage $V_1$ may be at least 400 Volts. A magnitude of the second voltage $V_2$ may be substantially equal to a magnitude of the first voltage $V_1$. A root mean square or RMS may be taken to evaluate the voltage.

Figure 5:
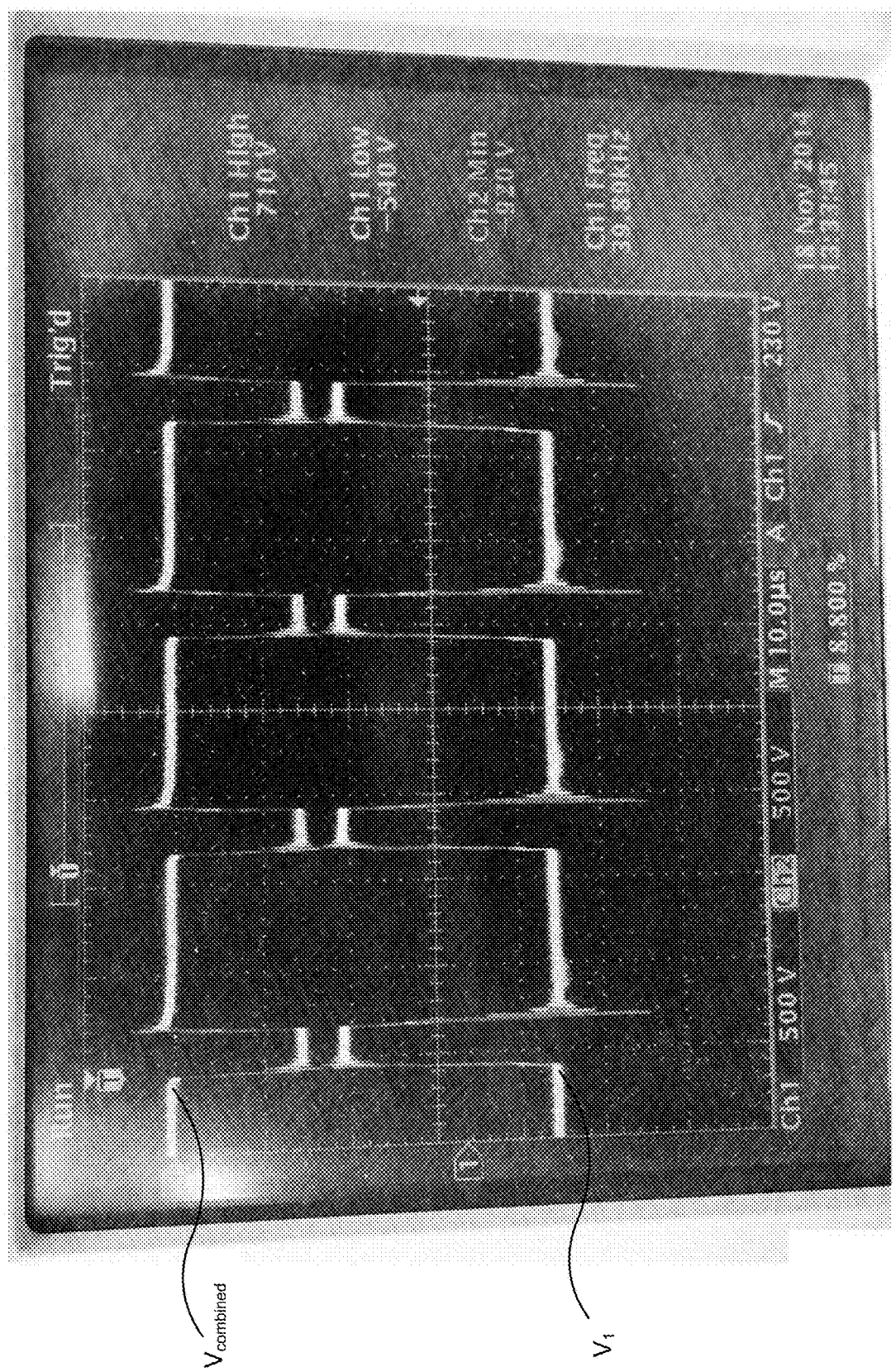
FIG. 5 is a graphical depiction of power supplied by an exemplary system.

It should also be noted that $V_1$ and $V_2$ may be respectively measured relative to the anode 108, while $V_{combined}$ may be measured relative to ground. With brief reference to FIG. 5, for example, shown is an oscilloscope illustrating a top trace representing the voltage of the anode, or $V_{combined}$, relative to ground, while the bottom trace illustrates a voltage applied to a first magnetron 102 relative to the anode 108. In some embodiments, $V_{combined}$ is at least 70% of $V_{sum}$. In some embodiments, $V_{combined}$ is at least 80% of $V_{sum}$.

Figure 3:
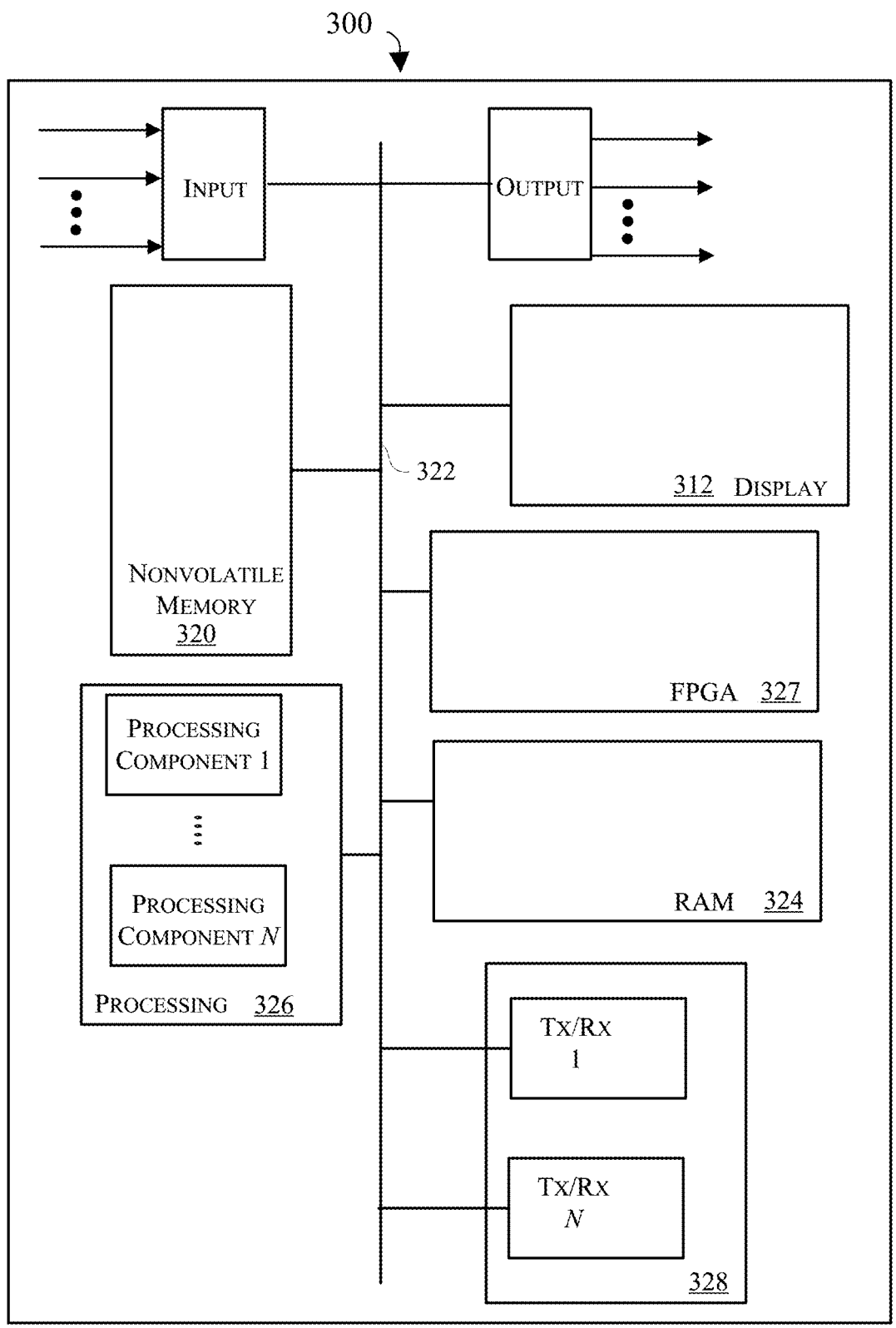
FIG. 3 is a block diagram illustrating aspects of some hardware components that may be implemented in the system illustrated in FIG. 1.

The methods described in connection with the embodiments disclosed herein may be embodied directly in hardware, in processor executable instructions encoded in non-transitory processor readable medium, or in a combination of the two. Referring to FIG. 3 for example, shown is a block diagram depicting physical components that may be utilized to realize the controller 144 according to an exemplary embodiment. As shown, in this embodiment a display portion 312 and nonvolatile memory 320 are coupled to a bus 322 that is also coupled to random access memory ("RAM") 324, a processing portion (which includes N processing components) 326, a field programmable gate array (FPGA) 327, and a transceiver component 328 that includes N transceivers. Although the components depicted in FIG. 3 represent physical components, FIG. 3 is not intended to be a detailed hardware diagram; thus many of the components depicted in FIG. 3 may be realized by common constructs or distributed among additional physical components. Moreover, it is contemplated that other existing and yet-to-be developed physical components and architectures may be utilized to implement the functional components described with reference to FIG. 3.

This display portion 312 generally operates to provide a user interface for a user, and in several implementations, the display is realized by a touchscreen display. In general, the nonvolatile memory 320 is non-transitory memory that functions to store (e.g., persistently store) data and processor executable code (including executable code that is associated with effectuating the methods described herein). In some embodiments for example, the nonvolatile memory 320 includes bootloader code, operating system code, file system code, and non-transitory processor-executable code to facilitate the execution of a method described with reference to FIG. 4.

In many implementations, the nonvolatile memory 320 is realized by flash memory (e.g., NAND or ONENAND memory), but it is contemplated that other memory types may be utilized as well. Although it may be possible to execute the code from the nonvolatile memory 320, the executable code in the nonvolatile memory is typically loaded into RAM 324 and executed by one or more of the N processing components in the processing portion 326.

The N processing components in connection with RAM 324 generally operate to execute the instructions stored in nonvolatile memory 320 to enable the power sources 140, 142 to achieve one or more objectives. For example, non-transitory processor-executable instructions to effectuate the methods described with reference to FIG. 4 may be persistently stored in nonvolatile memory 320 and executed by the N processing components in connection with RAM 324. As one of ordinary skill in the art will appreciate, the processing portion 326 may include a video processor, digital signal processor (DSP), graphics processing unit (GPU), and other processing components.

In addition, or in the alternative, the FPGA 327 may be configured to effectuate one or more aspects of the methodologies described herein (e.g., the method described with reference to FIG. 4). For example, non-transitory FPGA-configuration-instructions may be persistently stored in nonvolatile memory 320 and accessed by the FPGA 327 (e.g., during boot up) to configure the FPGA 327 to effectuate the functions of the controller 144.

The input component operates to receive signals that are indicative of one or more aspects of the power applied to the first magnetron 102 and/or the second magnetron 104. The signals received at the input component may include, for example, voltage, current, and/or power. The output component generally operates to provide one or more analog or digital signals to effectuate an operational aspect of the first and/or second power sources 140, 142. For example, the output portion may be a signal to cause the first power source and/or second power source 112, 114 to effectuate some of the methodologies described with reference to FIG. 4. In some embodiments, the output component operates to adjust a frequency and duty of the first and/or second power source 140, 142.

The depicted transceiver component 328 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Figure 4:
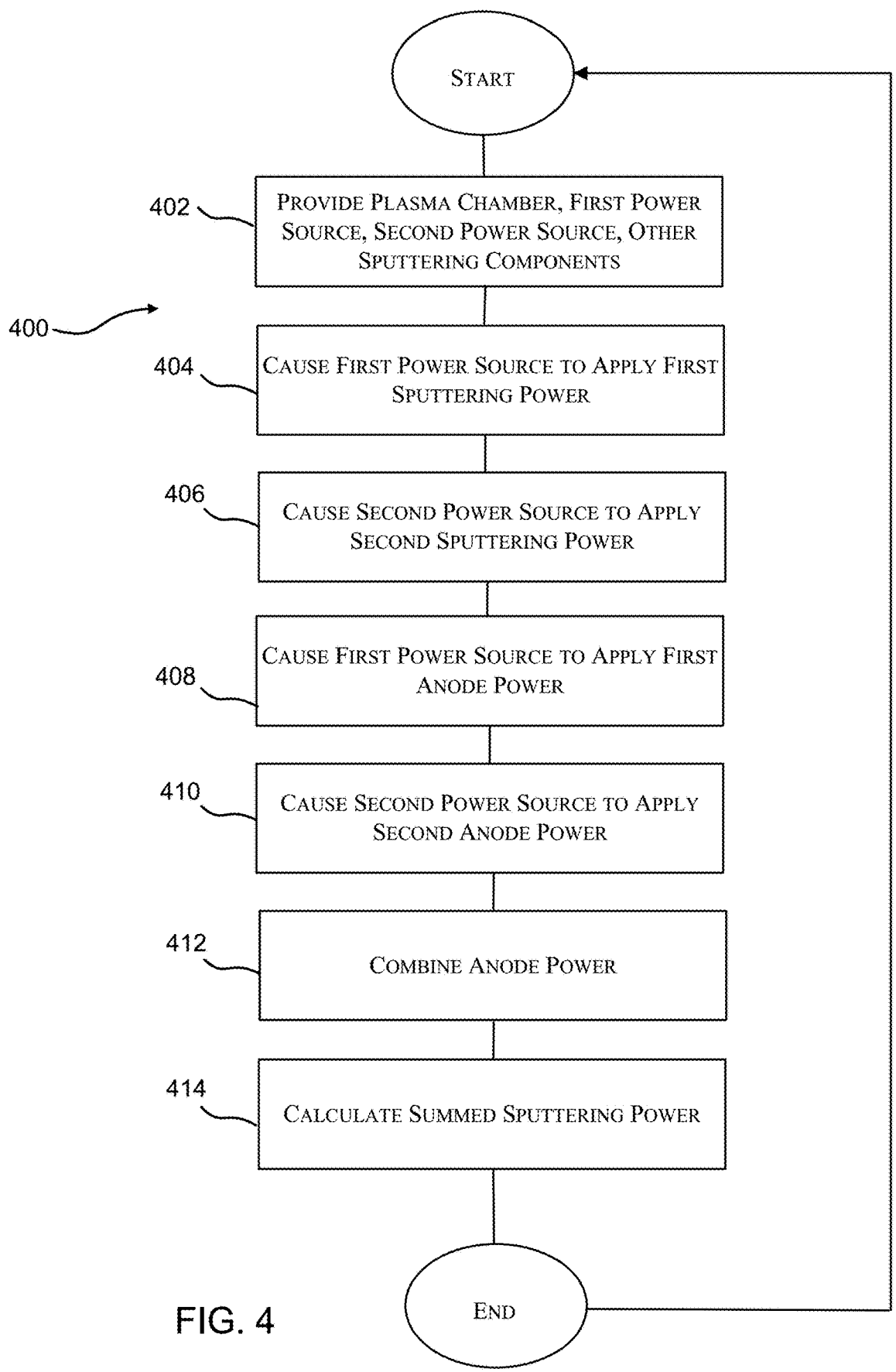
FIG. 4 is a flowchart of a method disclosed herein.

Turning now to FIG. 4, a method 400 of sputtering that may be executed by the system 100 in some embodiments is now described in more detail. The method 400 may include providing 402 a plasma chamber, a first power source, a second power source, and other sputtering components. Providing 402 may be achieved by providing a system such as system 100 described with reference to FIGS. 1-3. The method 400 may include causing 404 the first power source to apply a first sputtering power to the first magnetron for a first period of time. The method 400 may also include causing 406 the second power source to apply a second sputtering power to the second magnetron for the first period of time, the first sputtering power and the second sputtering power providing a summed sputtering voltage. In some embodiments, the method 400 may include calculating 414 one or more of a summed sputtering power, a summed sputtering voltage, and a summed sputtering current applied to the first magnetron and the second magnetron.

The method 400 may also include causing 408 the first power source to apply a first anode power to the anode for a second period of time following the first period of time. The method 400 may also include causing 410 the second power source to apply a second anode power to the anode for the second period of time, the first anode power and the second anode power providing a combined anode power.

The method 400 may include combining 412 an anode power to the anode such that the combined anode power, having a current and a voltage, has a voltage having a magnitude of at least 80% of a magnitude of the summed sputtering voltage.

In method 400, the first period of time may be at least 80% of a sputtering cycle, the sputtering cycle comprised of the first period of time and the second period of time. In some embodiments, the first period of time is at least 70% of the sputtering cycle. In some embodiments, the combined anode voltage has a magnitude of at least 800 Volts. In some embodiments, the first period of time $t_1$ may be between 70% and 90% of the cycle, and the second period of time $t_2$ may be between 30% and 10% of the cycle. In some embodiments, the first period of time $t_1$ may be between 80% and 90% of the cycle, and the second period of time $t_2$ may be between 20% and 10% of the cycle. In some embodiments, the first period of time $t_1$ may be between 85% and 90% of the cycle, and the second period of time $t_2$ may be between 15% and 10% of the cycle.

In some embodiments, the first sputtering power has a voltage having a magnitude of at least 300 Volts, and the second sputtering power has a voltage having a magnitude of at least 300 Volts.

In some embodiments, the combined anode power has a current and a voltage, the voltage having a magnitude of at least 1000 Volts.

In some embodiments, the anode is a floating anode comprising a gas bar having a gas inlet and a plurality of gas outlets shaped to provide a Hollow Cathode Effect.

In some embodiments, the method 400 includes causing a synchronizer to cause the first power source and the second power source to simultaneously apply power to the first magnetron and the second magnetron for the first period of time and to cause the first power source and the second power source to simultaneously apply power to the anode for the second period of time.

To determine basic functionality, the system 100 and method 400 previously described herein were tested using $TiO_x$ as the target material, 6.4 mTorr using 126 SCCM argon and 100 SCCM oxygen as the reactive gas, 4 kW of applied power per magnetron with a floating anode sitting between them, and a line speed of 10 inches per minute. Table 1 illustrates the results of the functionality test, establishing that the system 100 would operate.

TABLE 1

Functionality Test Observations at first plasma.

| Item | Voltage | Current |
|---|---|---|
| V1 (V of first magnetron 102 to anode 108) | −535 V | 7.2 A |
| V2 (V of second magnetron 104 to anode 108) | −565 V | 7.1 A |
| Voltage of Anode 108 to Ground | 850 V | NA |
| Anode | −680 $V_{combined}$ | 2.2 A |
| Voltage of first magnetron 102 to Ground | −720 V | NA |

The above functionality test verified that the system 100 was functional substantially as envisioned, and was attempting to deliver full power to the anode 108. Of note, an unforeseen result of the functionality test revealed that the anode power exhibited a current of just 2.2 Amperes, or about half of what was expected.

Applicant has determined that, because there was no magnetic enhancement on the anode 108, it would take very high voltages to do any more work beyond heating the anode 108, which was also found to be a desirable response. That is, $V_{combined}$ is high enough to result in a very low current at the anode 108 in the functionality test. Moreover, because the current is additive, a current at the anode 108 of just 2.2 Amperes indicates than a current approaching 0 is experienced at each of the first and second magnetrons 102, 104—another desirable result to prevent undesirable coating of the first and second magnetrons 102, 104 during an anode power pulse.

Beyond the functionality test, the system was tested under three other settings, described below under runs 1, 2, and 3. Benchmark runs 4 and 5 were also performed using a traditional AC sputtering system as described below. By measuring a film deposition thickness at the same given line speed, deposition rates could be calculated. The heat load or temperature of the substrate 122 was also measured, as was the voltage and current at the magnetrons 102, 140 and anode 108. Of note, the setup was run on a sputter-down machine with relatively small magnetrons, so process power was limited.

Figure 6:
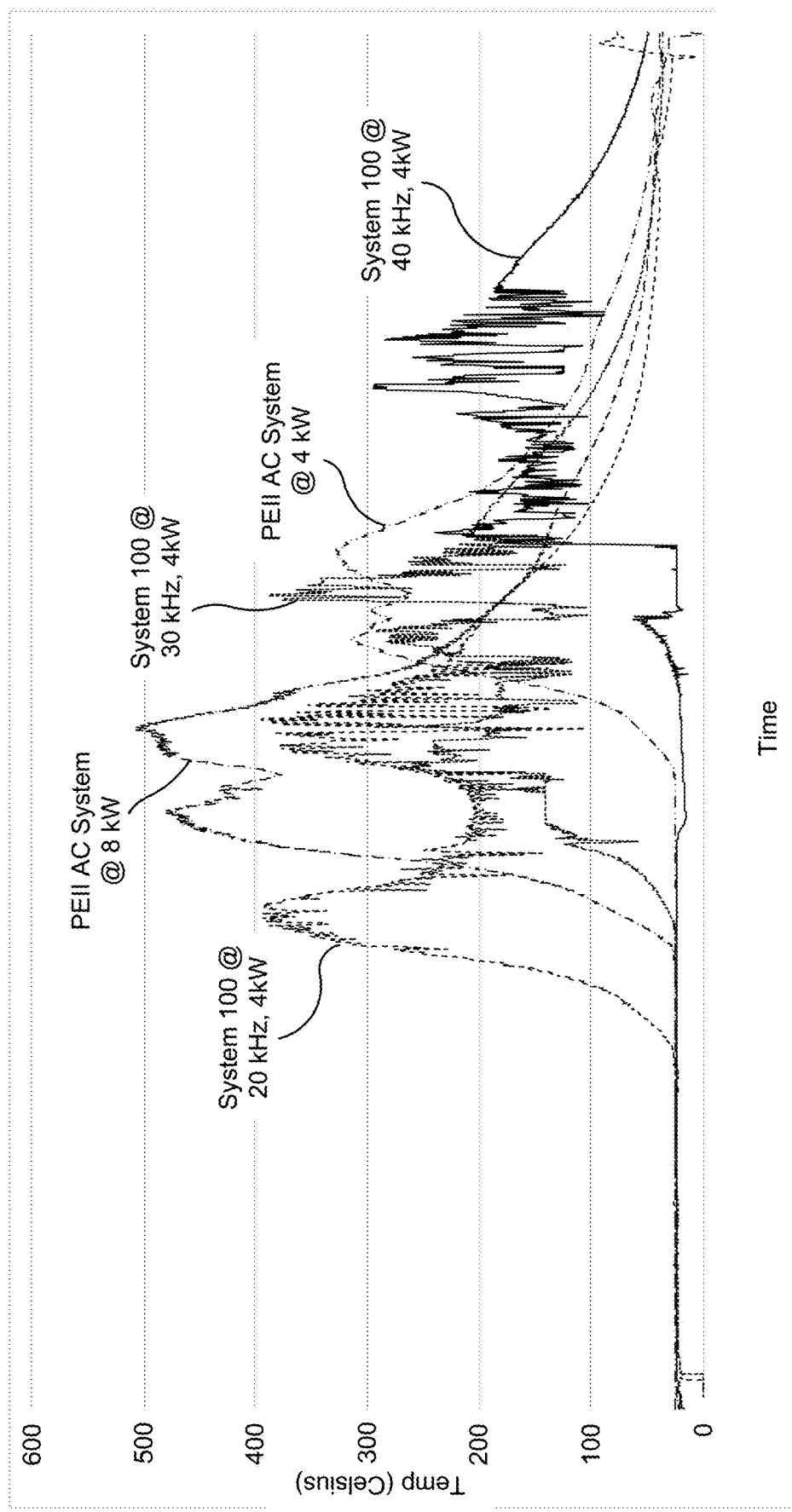
FIG. 6 is a graphical depiction of heat load test results of exemplary systems described herein, compared to traditional AC systems.

Turning now to FIG. 6, illustrating a summary of the heat load responses, a series of tests were performed at various frequencies, notably run 1 was at 20 kHz, run 2 was at 30 kHz, and run 3 was at 40 kHz with as much Side A ON time as possible, that is, with as much time of power application to the magnetrons.

To compare deposition rates and heat loads, the system 100 was compared to a currently available Advanced Energy PEII AC power supply, illustrated at benchmark test runs 4 and 5.

With each run, a film thickness measurement was taken using a Dektak® profilometer, with a Sharpie® mark on the bare glass. Scrubbing the coated glass over the Sharpie mark removes the coating so a good thickness step could be obtained.

Also with each run, the heat load on the substrate was measured by a SuperMole, which is a circuit board encased by many heat shields with a type K thermocouple superglued to the glass substrate. The SuperMole took real-time temperature measurements through the plasma and the results were then downloaded and stored.

With simultaneous reference now to FIGS. 6-9, the 5 runs were completed, with all machine setups maintained as described above. The results of the 5 runs are described below.

TABLE 2

Run 1. System 100 @ 4 kW, 20 kHz.

| DC Supply Settings | Power | Voltage | Current |
|---|---|---|---|
| $1^{st}$ DC supply 116 Settings | 4 kW | $V_1$ = 513 V | $I_1$ = 7.8 A |
| $2^{nd}$ DC supply 118 Settings | 4 kW | $V_2$ = 526 V | $I_2$ = 7.7 A |

| Side A Settings | Frequency | Side A | Side B | Boost |
|---|---|---|---|---|
| $1^{st}$ bi-polar DC supply 112 | 20 kHz | 90% | 10% | 50% |
| $2^{nd}$ bi-polar DC supply 114 | | | | |

| Side B (Anode 108) Settings | Voltage | Current |
|---|---|---|
| $1^{st}$ bi-polar DC supply 112 | $V_3$ = 589 V | $I_3$ = 2.8 A |
| $2^{nd}$ bi-polar DC supply 114 | $V_4$ = 598 V | $I_4$ = 3.4 A |
| Anode | $V_{combined}$ not measured | $I_{combined}$ = 6.2 A |

TABLE 3

Run 2. System 100 @ 4 kW, 30 kHz.

| DC Supply Settings | Power | Voltage | Current |
|---|---|---|---|
| $1^{st}$ DC supply 116 Settings | 4 kW | $V_1$ = 527 V | $I_1$ = 7.6 A |
| $2^{nd}$ DC supply 118 Settings | 4 kW | $V_2$ = 542 V | $I_2$ = 7.4 A |

| Side A Settings | Frequency | Side A | Side B | Boost |
|---|---|---|---|---|
| $1^{st}$ bi-polar DC supply 112 | 30 kHz | 85% | 15% | 50% |
| $2^{nd}$ bi-polar DC supply 114 | | | | |

| Side B (Anode 108) Settings | Voltage | Current |
|---|---|---|
| $1^{st}$ bi-polar DC supply 112 | $V_3$ = 637 V | $I_3$ = 2.2 A |
| $2^{nd}$ bi-polar DC supply 114 | $V_4$ = 647 V | $I_4$ = 2.2 A |
| Anode | $V_{combined}$ not measured | $I_{combined}$ = 4.4 A |

TABLE 4

| Run 3. System 100 @ 4 kW, 40 kHz. | | | |
|---|---|---|---|
| DC Supply Settings | Power | Voltage | Current |
| 1$^{st}$ DC supply 116 Settings | 4 kW | $V_1$ = 545 V | $I_1$ = 7.3 A |
| 2$^{nd}$ DC supply 118 Settings | 4 kW | $V_2$ = 552 V | $I_1$ = 7.2 A |
| Side A Settings | Frequency | Side A | Side B | Boost |
| 1$^{st}$ bi-polar DC supply 112<br>2$^{nd}$ bi-polar DC supply 114 | 40 kHz | 80% | 20% | 50% |
| Side B (Anode 108) Settings | Voltage | | Current |
| 1$^{st}$ bi-polar DC supply 112 | $V_3$ = 678 V | | $I_3$ = 2.2 A |
| 2$^{nd}$ bi-polar DC supply 114 | $V_4$ = 680 V | | $I_4$ = 2.2 A |
| Anode | $V_{combined}$ not measured | | $I_{combined}$ = 4.4 A |

TABLE 5

| Run 4. Traditional AC System @ 4 kW. | | | |
|---|---|---|---|
| PEII Settings | Power | Voltage | Current |
| PEII AC Power Settings | 4 kW | 570 V | 7.6 A |

TABLE 6

| Run 5. Traditional AC System @ 8 kW. | | | |
|---|---|---|---|
| PEII Settings | Power | Voltage | Current |
| PEII AC Power Settings | 8 kW | 630 V | 14 A |

Figure 7:
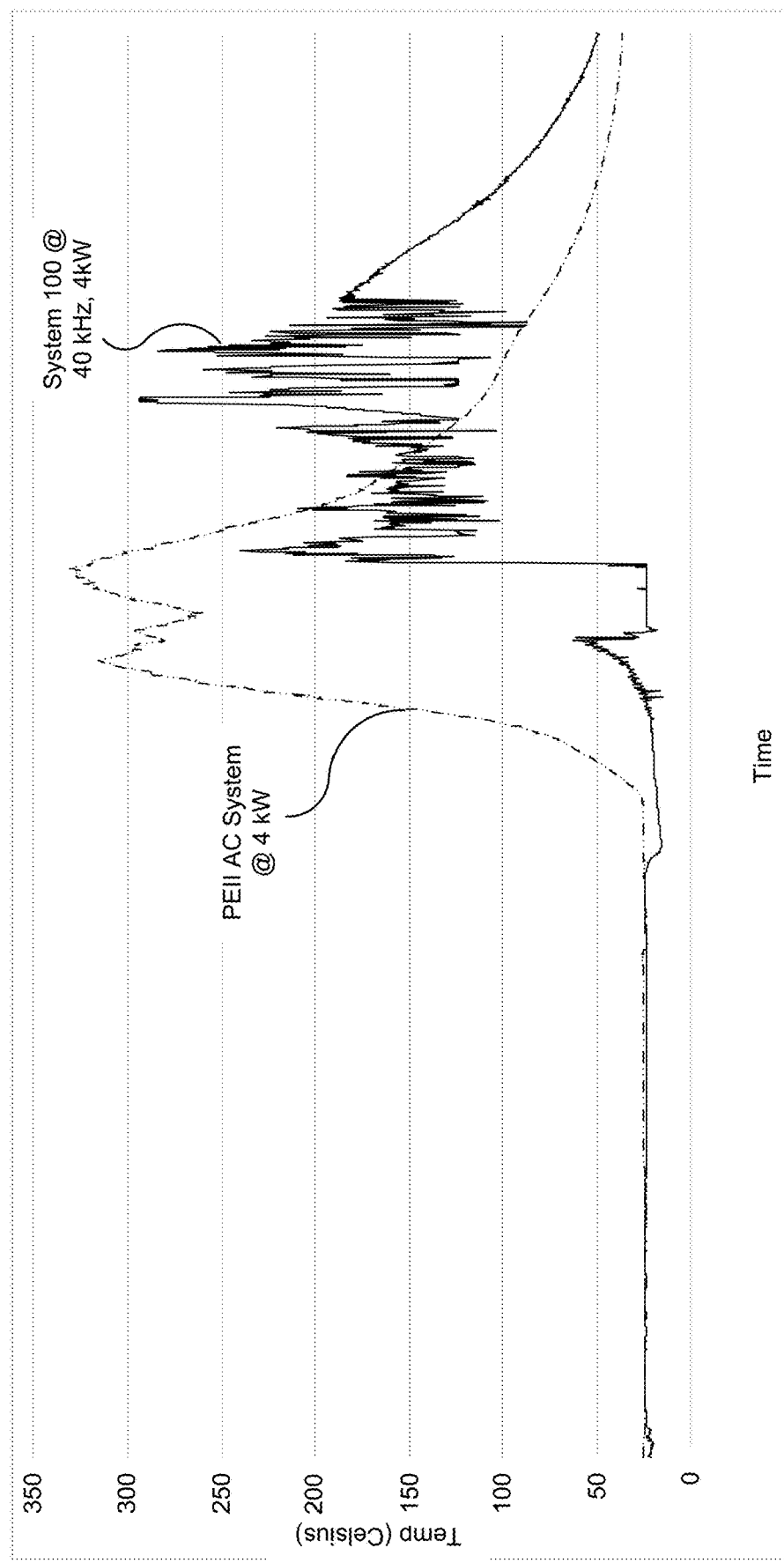
FIG. 7 is a graphical depiction of a heat load resulting from the use of a system described herein at 4 kW, compared to a traditional AC system at 4 kW.
Figure 8:
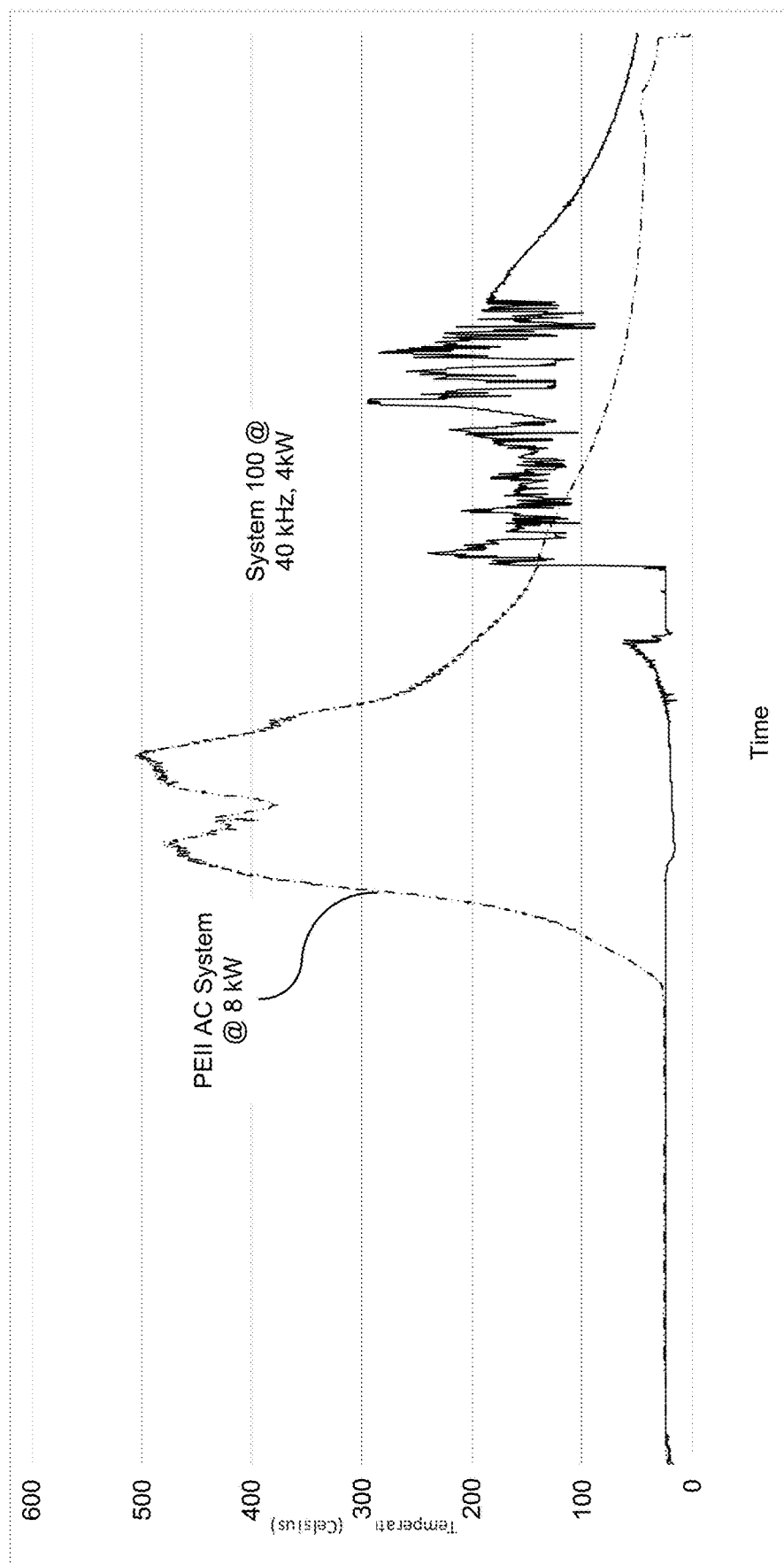
FIG. 8 is a graphical depiction of a heat load resulting from the use of a system described herein at 4 kW, compared to a traditional AC system at 8 kW.
Figure 9:
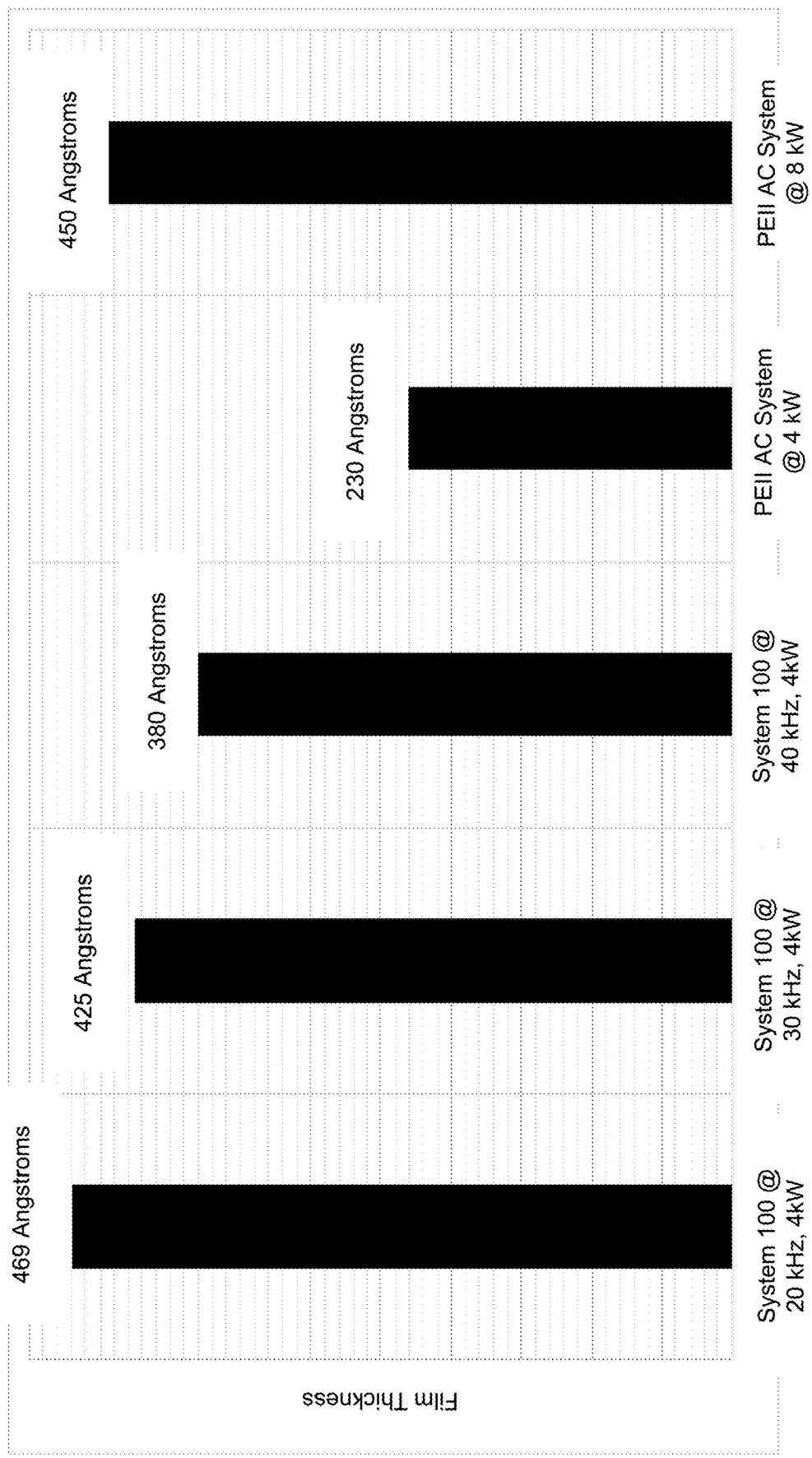
FIG. 9 is a graphical depiction of film thickness or deposition rates achieved using various settings of an exemplary system disclosed herein, compared to various traditional AC systems.

FIG. 7 illustrates the heat load results of the system 100 running at 40 kHz and 4 kW, as compared to an AC system at 4 kW. FIG. 8 illustrates the heat load results of the system 100 running at 40 kHz and 4 kW, as compared to an AC system at 8 kW. FIG. 9 illustrates the resulting film thickness for each of the 5 runs (runs 1-3 being test runs and runs 4-5 being benchmark tests of AC systems).

With reference now to FIGS. 7 and 9, FIG. 7 indicates that the system 100 results in less heating (under 300 degrees Celsius verses over 300 degrees Celsius). Moreover, and with reference to tables 3 and 5, the system 100 provides a combined current Icombined of 4.4 Amperes at a power of 4 kW, while an AC system at 4 kW provides a current of 7.6 Amperes. That is, at the same power wattage settings, the system 100 causes the anode 108 to experience significantly less current (4.4 Amperes verses 7.6 Amperes), resulting in a relatively hot anode, improving cleaning properties of the anode, and yet maintaining a relatively cool substrate. In light of FIG. 9, the system 100 at the same power settings of a traditional AC system results in a much improved deposition rate (over 350 Angstroms verses about 225 Angstroms), meaning that a processing facility may realize significant yields without damage to sensitive substrates, such as polyethylene.

With reference now to FIGS. 8 and 9, illustrating the system 100 with the first and second bi-polar DC supplies 112, 114 operating at 40 kHz, and the first and second DC supplies 116, operating at 4 kW per side, compared to a traditional PEII AC system running at 8 kW, it is noted that, although the traditional system resulted in a thicker film, the system 100 resulted in a much lower heat load. That is, although the deposition rate was just slightly more with the traditional system, the heat load was half on the system 100 as herein described. While this is interesting it is not where a usual process engineer would be when an AC power or current limit is hit and more deposition rate is required. For example, if a sputtering zone is running at 90 kW and is hitting the 300 amp AC current limit a traditional system, a system 100 is described herein could be used instead. Placing two 120 kw power supplies 140, 142 in place of a 120 kW AC delivery system would result in the dramatic differences illustrated in FIGS. 7 and 9. With a system 100 as herein described, it is possible to push more power into the power-delivery system without breaching the inductive heating current limit. The system 100 may improve production speeds, add deposition rates without adding cathode lids, use existing cathodes to their fullest extent, and keep substrates much cooler.

With reference to tables 3 and 6, one can see that the system 100 provides a combined current $I_{combined}$ of 4.4 Amperes at a power of 4 kW, while an AC system at 8 kW provides a current of 14 Amperes. Taken in light of FIG. 9, one can see that the system 100 at 4 kW and 40 kHz results in a deposition rate that approaches that of a traditional AC system at twice the power, but resulting in significantly less current (4.4 Amperes verses 14 Amperes) and a much lower heat load (about 300 degrees Celsius verses over 500 degrees Celsius).

A close analysis of FIG. 9 reveals that using a first power supply 140 and a second power supply 142 as previously described herein increases the deposition rates as compared to a traditional AC type sputtering system at the same power. For example, the system 100 running at 4 kW per side and 20 kHz results in a film thickness of 470 Angstroms, while the traditional PEII AC system at 4 kW results in a film thickness of just 230 Angstroms. To approach the deposition rates of the system 100, a traditional AC system would have to apply more than 8 kW of power.

Put succinctly, Applicant has provided a system, method, and means for increasing the deposition rate while drastically reducing the heat load experienced by the substrate 122 at the same or lower power as that of a traditional AC system, and the current experienced by the anode 108 and magnetrons 102, 104, which, as previously described, was an unexpected result.

Returning now to FIG. 6, one can deduce that system 100 may run at any number of frequencies, including 20, 30, and 40 kHz, or others and provide a much better Angstrom/substrate temperature profile consistently over traditional AC power delivery.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. A pulsed power system, comprising:
   a first power lead, a second power lead, and a third power lead;
   a first power source coupled to the first power lead and the second power lead, the first power source configured to provide a first voltage to the first power lead that alternates between positive and negative relative to the second power lead during each of multiple cycles;

a second power source coupled to the second power lead and the third power lead, the second power source configured to provide a second voltage to the third power lead that alternates between positive and negative relative to the second power lead during each of the multiple cycles; and a controller programmed to control the first power source and the second power source to phase-synchronize the first voltage with the second voltage, so both, the first voltage and the second voltage simultaneously cross zero volts.

2. The system of claim 1, wherein:
the controller comprises a processor, and the controller is configured with a non-transitory memory comprising non-transitory instructions executable by the processor.

3. The system of claim 1, wherein:
the controller comprises a field programmable gate array, and the controller is configured with a non-transitory memory including non-transitory instructions accessible by the field programmable gate array to configure the field programmable gate array.

4. The system of claim 1, wherein:
the first power source comprises a first direct current power supply coupled to a first bi-polar controllable pulsed direct current power supply, the first bi-polar controllable pulsed direct current power supply configured to provide an alternating direct current power to the first power lead and the second power lead; and
the second power source comprises a second direct current power supply coupled to a second bi-polar controllable pulsed direct current power supply, the second bi-polar controllable pulsed direct current power supply configured to provide an alternating direct current power to the third power lead and the second power lead.

5. The system of claim 1, wherein:
the controller is configured to control the first power source and the second power source, so both, the first voltage and the second voltage are simultaneously positive relative to the second power lead at least 70 percent of the multiple cycles.

6. A non-transitory memory including non-transitory instructions that are,
at least one of, executable by a processor to execute a method and accessible by a field programmable gate array to configure the field programmable gate array to execute the method, the method comprising:
causing a first power source to apply a first voltage to a first power lead that alternates between positive and negative relative to a second power lead;
causing a second power source to apply a second voltage to a third power lead that alternates between positive and negative relative to the second power lead; and
causing the first power source and the second power source to phase-synchronize the first voltage with the second voltage, so both, the first voltage and the second voltage simultaneously cross zero volts.

7. The non-transitory memory of claim 6, wherein:
the first voltage and the second voltage are simultaneously positive at least 70 percent of a time over the multiple cycles.

8. The non-transitory memory of claim 6, wherein:
the first voltage has a positive magnitude that is the same as a negative magnitude of the first voltage; and
the second voltage has a positive magnitude that is the same as a negative magnitude of the second voltage.

9. A method of pulsed direct current sputtering, comprising:
providing a first power lead, a second power lead, and a third power lead;
coupling a first power source to the first power lead and the second power lead;
coupling a second power source to the third power lead and the second power lead;
coupling a controller to both the first and second power sources;
applying, with the first power source, a first voltage to the first power lead that alternates between positive and negative relative to the first-second power lead;
applying, with the second power source, a second voltage to the third power lead that alternates between positive and negative relative to the second power lead; and
phase-synchronizing, with the controller, the first voltage with the second voltage, so both, the first voltage and the second voltage, are simultaneously cross zero volts.

10. The method of claim 9, wherein:
the first voltage and the second voltage at the second power lead are simultaneously positive relative to the second power lead at least 70 percent of a time over the multiple cycles.

11. The method of claim 10, wherein:
the first voltage and the second voltage are simultaneously positive relative to the second power lead at least 80 percent of the time over the multiple cycles.

12. The method of claim 11, wherein:
the first voltage and the second voltage are simultaneously positive relative to the second power lead between 70 and 90 percent of a time over the multiple cycles.

13. The method of claim 9, wherein:
the first voltage has a positive magnitude that is the same as a negative magnitude of the first voltage; and
the second voltage has a positive magnitude that is the same as a negative magnitude of the second voltage.

14. The method of claim 9 including:
providing the second power lead as a floating power lead.

15. The system of claim 1, wherein the controller is programmed to control the first power source and the second power source to phase-synchronize the first voltage with the second voltage, so both, the first voltage and the second voltage simultaneously cross zero volts two times in each cycle.

16. The system of claim 1, wherein the controller is programmed with hardware.

17. The system of claim 6, wherein the non-transitory memory comprises non-transitory instructions to cause the first power source and the second power source to phase-synchronize the first voltage with the second voltage, so both, the first voltage and the second voltage simultaneously cross zero volts two times in a cycle.

* * * * *